(12) United States Patent
Kinsel

(10) Patent No.: US 8,179,145 B2
(45) Date of Patent: May 15, 2012

(54) METHOD AND APPARATUS FOR TESTING AFCI DEVICE FOR SERIES ARC DETECTION

(75) Inventor: Hugh T. Kinsel, Sugar Hill, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 574 days.

(21) Appl. No.: 12/356,620

(22) Filed: Jan. 21, 2009

(65) Prior Publication Data
US 2009/0189615 A1 Jul. 30, 2009

Related U.S. Application Data

(60) Provisional application No. 61/023,152, filed on Jan. 24, 2008.

(51) Int. Cl.
*G01R 31/02* (2006.01)
(52) U.S. Cl. ....................................... 324/536; 324/509
(58) Field of Classification Search .................. 324/509, 324/536, 424
See application file for complete search history.

(56) References Cited

U.S. PATENT DOCUMENTS

| | | | |
|---|---|---|---|
| 6,313,641 B1 | 11/2001 | Brooks | |
| 6,362,628 B2 * | 3/2002 | MacBeth et al. | 324/536 |
| 6,426,632 B1 | 7/2002 | Clunn | |
| 7,253,629 B1 | 8/2007 | Finlay, Sr. | |
| 2003/0160619 A1 * | 8/2003 | Parker | 324/536 |
| 2004/0012393 A1 * | 1/2004 | Schmalz et al. | 324/424 |
| 2004/0174173 A1 * | 9/2004 | Elms et al. | 324/509 |
| 2004/0207407 A1 | 10/2004 | Shander | |

FOREIGN PATENT DOCUMENTS

| WO | WO 9635250 A | 11/1996 |
|---|---|---|
| WO | WO 03102613 A | 12/2003 |

* cited by examiner

*Primary Examiner* — Vincent Q Nguyen

(57) ABSTRACT

Testing an AFCI device includes providing an AFCI device to be tested and a load, wherein the AFCI device and the load form an electrical circuit, applying AC power to the AFCI device, generating a high frequency broadband noise signal, amplifying the high frequency broadband noise signal, modulating the amplified high frequency noise signal with a signal synchronized to the load current or load voltage to provide synchronized high frequency broadband noise bursts, coupling the noise bursts into the electrical circuit to simulate series arcing signals, determining if the AFCI device opens the electrical circuit within a predetermined amount of time, indicating the AFCI device has passed the test if the AFCI opens the electrical circuit within the predetermined amount of time, and indicating the AFCI device has failed the test if not.

41 Claims, 9 Drawing Sheets

SERIES ARC IN ELECTRICAL BRANCH

SERIES ARC TEST SETUP

SIMULATED SERIES ARC TEST SETUP

SIMULATED SERIES ARC SIGNAL GENERATION

SIMULATED SERIES ARC TEST SETUP

SIMULATED SERIES ARC TEST SETUP

METHOD AND APPARATUS FOR TESTING AFCI DEVICE FOR SERIES ARC DETECTION

CROSS-REFERENCE TO RELATED APPLICATION

This application claims the benefit of the U.S. Provisional Patent Application Ser. No. 61/023,152, filed on Jan. 24, 2008, titled "Method And Apparatus For Testing AFCI Device for Series Arc Detection," the disclosure of which is incorporated herein by reference.

TECHNICAL FIELD

The present invention relates generally to testing AFCI devices. More particularly, the invention encompasses a method and an apparatus for testing AFCI devices for series arc detection.

BACKGROUND ART

An Arc-Fault Circuit Interrupter (AFCI) is a device that is designed to mitigate the effects of arcing faults by functioning to de-energize the circuit when an arc fault is detected. Specifically, AFCI devices detect the presence of parallel arcing and series arcing in AC power systems. When arcing is detected, the AFCI device opens the electrical branch protected by the device. Arcing faults typically occur in damaged or deteriorated wires and cords. Some causes of damaged and deteriorated wiring include puncturing of wire insulation, natural aging and wire exposure to heat vents or harsh environmental conditions.

Prior art devices for testing AFCI devices typically employ a series arcing device such as an electromechanical arc gap and a point contact relay. These devices would typically be used in series with a test load to generate actual series arcing to test the AFCI device for its ability to detect series arcing. However, such a prior art device has many disadvantages. For example, the electromechanical arc gap and relay are large mechanical devices that consume much space. Another disadvantage is that closing and opening the point contact relay results in series arcing which may interfere with the intended signal induced by the electromechanical arc gap. Also, it is difficult to build an electromechanical arc gap with consistent signal characteristics which are necessary for testing AFCI devices with repeatable results, especially in large volumes. Furthermore, it is difficult to control or calibrate characteristics of the arc signal generated from the aforementioned prior art series arcing device. Such control and calibration are necessary in order to achieve testing of AFCI devices with repeatable results. Another disadvantage is that series arcing is destructive to the electrodes across an arc gap and require constant replacement. Yet another disadvantage is that the characteristics of the arc signal are affected by the destruction of the electrodes across an arc gap, the heating of the electrodes across an arc gap, the heating of the environment in and around the arc gap, and the relative humidity of the environment in and around the arc gap. Finally, there is the potential for electric shock if the arc gap is exposed.

Thus, there exists a need for a method and an apparatus for testing AFCI devices for series arc detection that substantially eliminate the foregoing problems.

DISCLOSURE OF THE INVENTION

The present invention overcomes the problems and deficiencies of prior art devices for testing AFCI devices by providing a novel apparatus and method for testing AFCI device for series arc detection. Specifically, the method and apparatus of the present invention generate a test signal that simulates a signal characteristic of series arcing in AC power systems. The simulated signal is used to test AFCI devices for their ability to detect series arcing in AC power systems. The test signal is coupled into the load circuit thereby eliminating the need for an actual series arcing device and a point contact relay switch in the load circuit.

A distinctive advantage of the present invention is that it can be used to test AFCI devices in large volumes, such as in a production line.

Another advantage of the present invention is that it can be configured as a portable tester for testing AFCI devices already installed in residences.

A further advantage of the present invention is that is provides consistent signals representing series arcing.

One object of the present invention is to provide a method and apparatus for testing AFCI devices for series arc detection that can be implemented at reasonable costs.

Another object of the present invention is to provide an apparatus for testing AFCI devices for series arc detection that consumes relatively less space than prior art apparatuses.

Thus, in one aspect, the present invention is directed to a method for testing an AFCI device, comprising the steps of providing an AFCI device-under-test and a load, wherein the AFCI device and the load form an electrical circuit, applying an AC power to the AFCI device, generating a high frequency broadband noise signal, modulating the high frequency broadband noise signal with a signal synchronized to the load current or load voltage to provide synchronized high frequency broadband noise bursts, coupling the synchronized high frequency broadband noise bursts into the electrical circuit to simulate series arcing signals, and determining if the AFCI device opens the electrical circuit.

In another aspect, the present invention is directed to a method for testing an AFCI device. In one embodiment, the method comprises the steps of providing an AFCI device to be tested and a load, wherein the AFCI device and the load form an electrical circuit, applying AC power to the AFCI device, generating a high frequency broadband noise signal, amplifying the high frequency broadband noise signal to provide an amplified high-frequency broadband noise signal, modulating the amplified high frequency broadband noise signal with a signal synchronized to the load current or load voltage to provide synchronized high frequency broadband noise bursts, coupling the synchronized high frequency broadband noise bursts into the electrical circuit to simulate series arcing signals, determining if the AFCI device opens the electrical circuit within a predetermined amount of time, indicating the AFCI device has passed the test if the AFCI opens the electrical circuit within the predetermined amount of time, and indicating the AFCI device has failed the test if the AFCI device fails to open the electrical circuit within the predetermined amount of time.

Other purposes, advantages and features of the present invention are described in the ensuing description.

BRIEF DESCRIPTION OF THE DRAWINGS

The features of the invention that are novel and the elements characteristic of the invention are set forth with particularity in the appended claims. The drawings are for illustration purposes only and are not drawn to scale. Furthermore, like numbers represent like features in the drawings. The invention itself, both as to organization and method of operation, may best be understood by reference to the detailed description which follows taken in conjunction with the accompanying drawings in which:

BEST MODE FOR CARRYING OUT THE INVENTION

Figure 1:
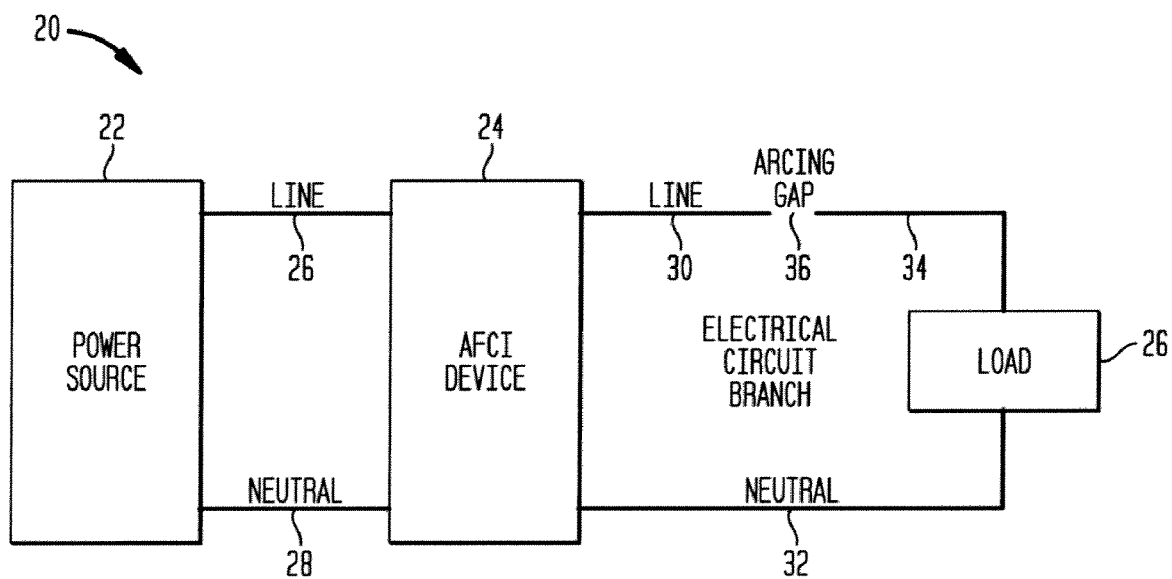
FIG. 1 is block diagram of an AC power system having an AFCI device and an electrical circuit branch, the AC power system experiencing series arcing in the electrical circuit branch.
Figure 2:
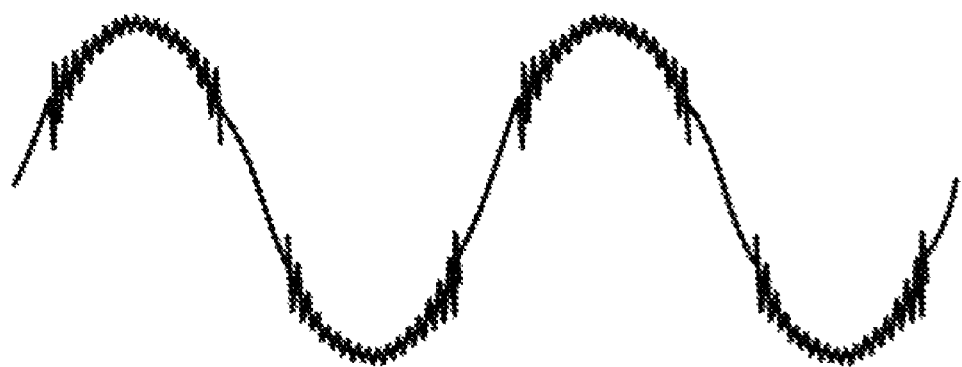
FIG. 2 is a voltage waveform resulting from series arcing in the AC power system of FIG. 1 when the load is a resistive load wherein the current is in phase with the voltage.
Figure 3:
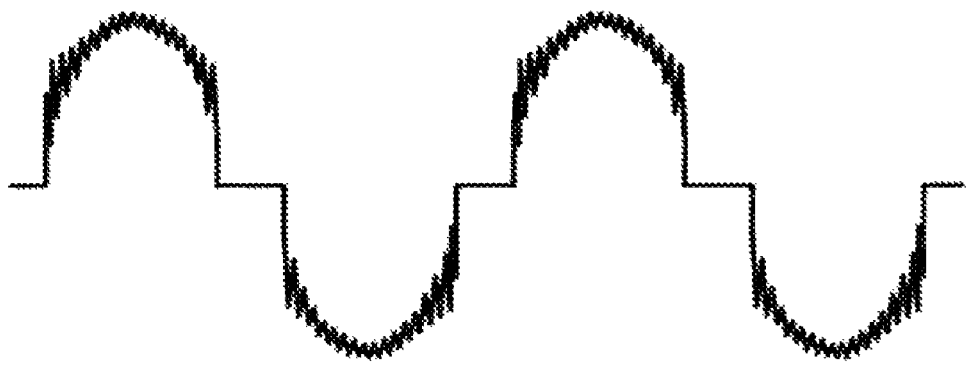
FIG. 3 is a current waveform resulting from series arcing in the AC power system of FIG. 1.
Figure 4:
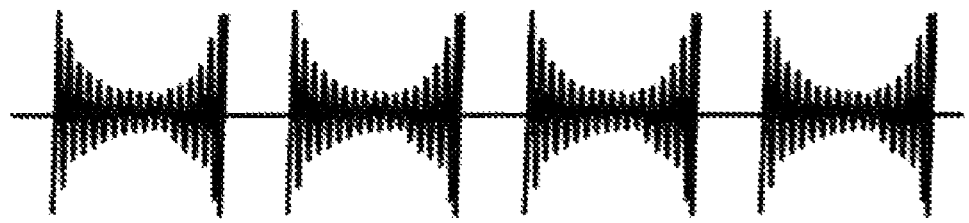
FIG. 4 is a waveform of bursts of high frequency broadband noise that results from series arcing in the AC power system of FIG. 1.
Figure 5:
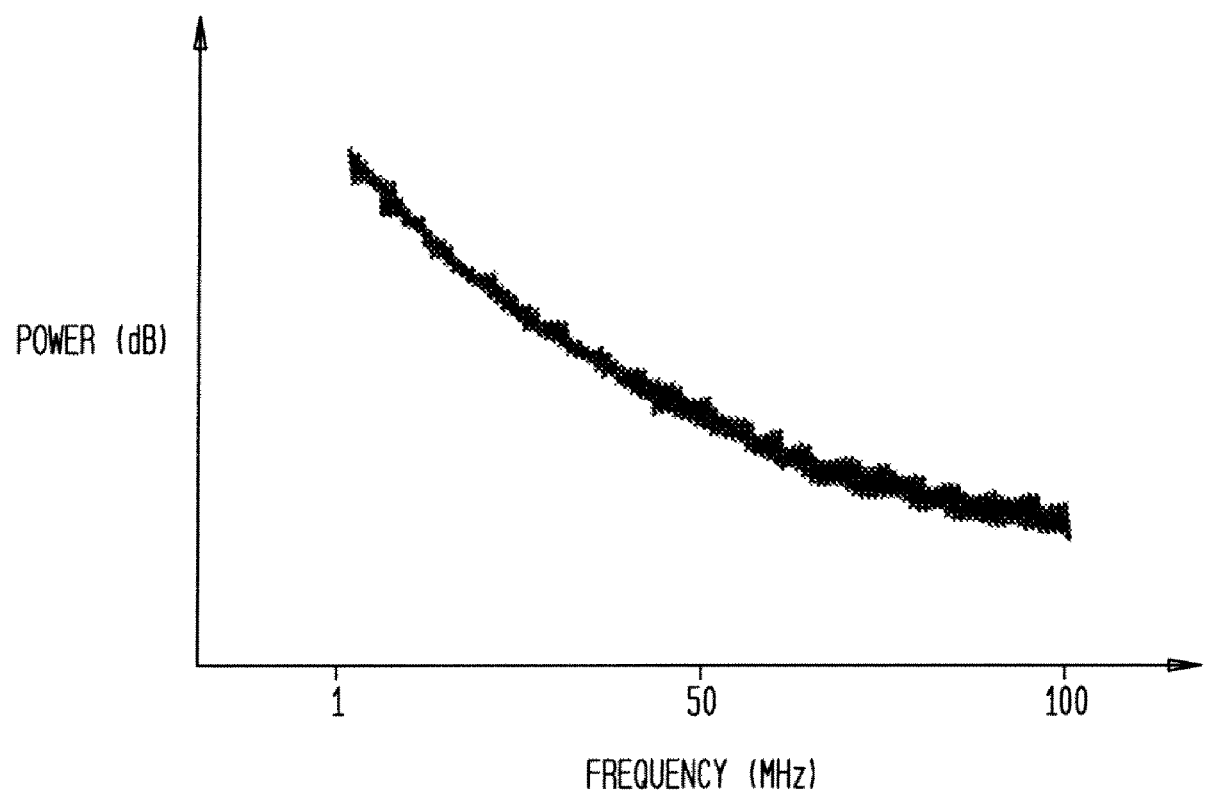
FIG. 5 is graph of signal power versus frequency which illustrates the amplitude of high frequency broadband noise level, at a fixed point in time during a burst, which decreases at higher frequencies.

Referring to FIG. 1, there is shown a typical AC powered electrical system 20 that comprises power source 22 and AFCI device 24. Line voltage wire and neutral wire 28 are connected to and between power source 22 and AFCI device 24. The output of AFCI device 24 is connected to load 26 by line voltage wire and neutral wire 32 thereby forming an electrical circuit branch, generally indicated by reference number 34. A small arcing gap 36 occurs in the electrical circuit branch 34 due to any of the reasons discussed in the foregoing "Background Art" section, such as a loose connection in the wiring or any other deteriorated condition in an electrical circuit branch 34. Series arcing occurs when the electrical circuit is closed with a load and a high enough voltage develops across arcing gap to breakdown the medium (usually air). This allows current to flow through the load. The resulting current waveform is shown in FIG. 3. The resulting voltage waveform is shown in FIG. 2 for a real load (resistive) where the current is in phase with the voltage. The occurrence of series arcing in AC power systems also results in bursts of high frequency broadband noise in an electrical branch. The bursts of high frequency broadband noise occur at a rate of twice the frequency of the AC power system provided the load draws current during the positive and negative half cycles of the AC power waveform. The amplitude of the high frequency broadband noise is typically higher at the beginning and the end of the burst. The high frequency broadband noise with the low frequency component removed is shown in FIG. 4. The amplitude of high frequency broadband noise at a fixed point in time during a burst decreases at higher frequencies as shown in FIG. 5.

Figure 6:
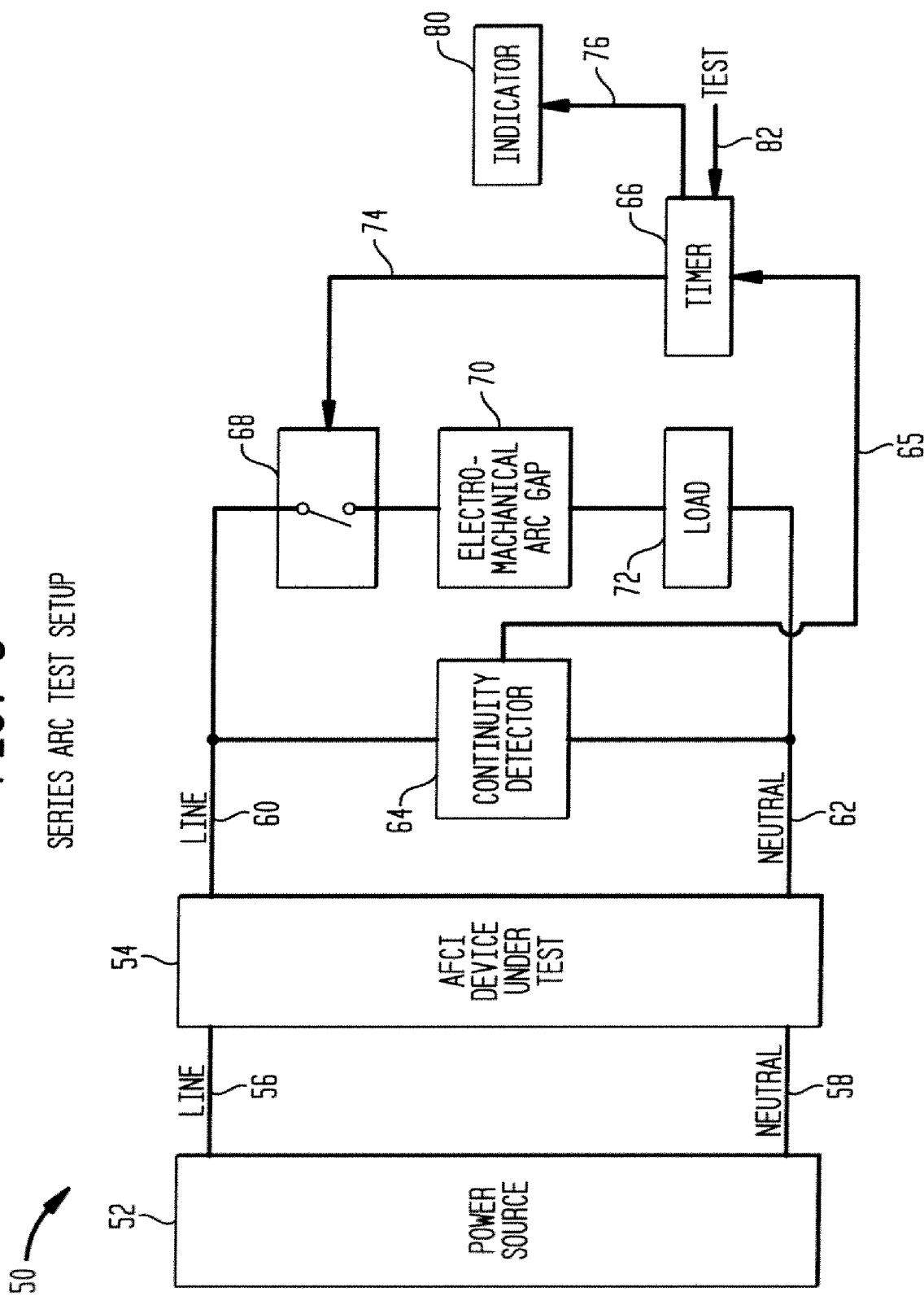
FIG. 6 is a block diagram of a prior art series arc tester for an AFCI device.

Referring to FIG. 6, there is shown a prior art series arc testing apparatus 50. Apparatus 50 comprises power source 52 that is connected to AFCI device-under-test 54 by line voltage wire 56 and neutral wire 58. AFCI device-under test 54 has outputs that are connected to line voltage wire 60 and neutral wire 62. Continuity detector 64 is connected between line voltage wire 60 and neutral wire 62. Continuity detector 64 outputs signal 65 to timer device 66. Point contact single pole single throw (SPST) relay switch 68, electromechanical arc gap device 70 and real load 72 are connected in series between line voltage wire 60 and neutral wire 62. Timer device 66 provides control signal 74 that is connected to relay switch 68. Timer device 66 also provides a signal 76 for input to indicator device 80. Timer device 66 has an input for receiving a test start signal 82. A test operator causes generation of test start signal 82 that is inputted into timer device 66. Test start signal 82 causes timer device 66 to reset, start a clock, and outputs control signal 74 which closes relay switch 68. When closed, relay switch 68 provides power to real load 72 through electromechanical arc gap device 70. Typically the load current is 5 amps and is currently the present requirement per UL1699. AFCI device-under-test should detect the arc fault and open the circuit in less than 1 second per UL1699. Continuity detector 64 detects the open circuit and outputs signal 65 to timer device to stop the clock. Timer device 66 then outputs signal 76 to indicator device 80 to alert operator that AFCI device-under-test 54 has failed if the elapsed time on the clock exceeds one (1) second. The elapsed time can also be sent to indicator device 80 and recorded.

Figure 7:
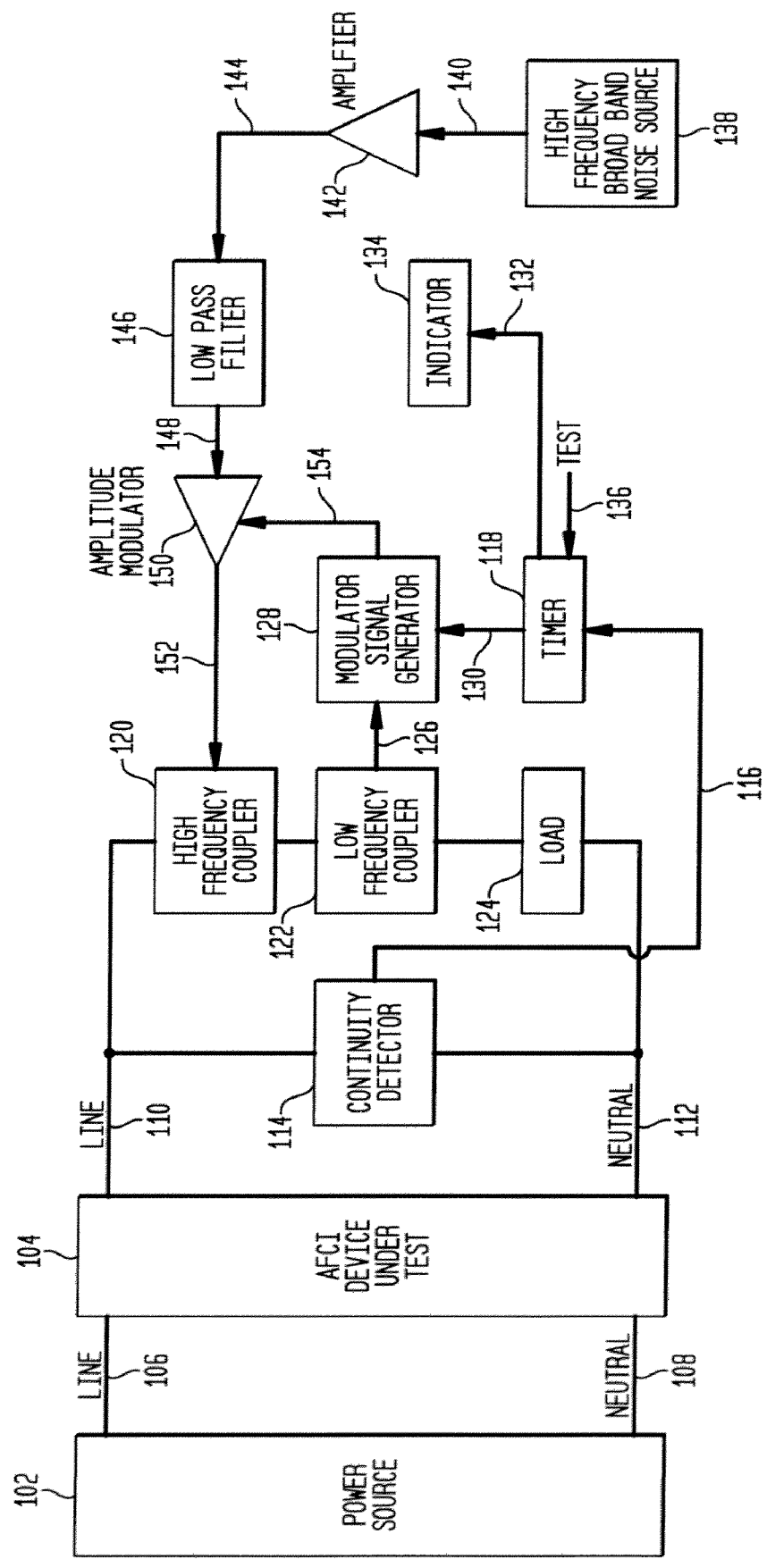
FIG. 7 is a block diagram of the series arcing simulator apparatus of the present invention.

Referring to FIG. 7, there is shown series arcing simulator apparatus 100 of the present invention. First, the general configuration of apparatus 100 is now described and the electrical relationship between the components of apparatus 100 is discussed in detail thereafter. Power source 102 is connected to AFCI device-under-test 104 by line voltage wire 106 and neutral wire 108. AFCI device-under test 104 has outputs that are connected to line voltage wire 110 and neutral wire Continuity detector 114 is connected between line voltage wire 110 and neutral wire 112. Continuity detector 114 provides signal 116 to timer device 118. High frequency coupler 120, low frequency coupler 122 and real load 124 are connected in series between line voltage wire 110 and neutral wire 112. Low frequency coupler 122 provides signal 126 to modulation signal generator 128. Signal 126 is the low frequency component of the AC power signal provided by power source 102. Timer device 118 provides control signal 130 to modulation signal generator 128. Timer device 118 also provides signal 132 to indicator device 134. Timer device 118 includes an input for receiving a test start signal 136 that is initiated by a test operator. Apparatus 100 includes high frequency broad band noise source 138 which outputs high frequency broadband noise signal 140 that is inputted into amplifier 142. Amplifier 142 outputs an amplified high frequency broadband noise signal 144 that is inputted into low pass filter 146. Low pass filter 146 outputs filtered signal 148 that is fed to amplitude modulator 150. Amplitude modulator 150 modulates signal 148 with modulating signal 154 to produce modulated signal 152. Modulated signal 152 is fed to high frequency coupler 120. Amplitude modulator 150 also receives signal 154 that is generated by modulation signal generator 128. Signal 154 is synchronized to the load current or load voltage. The energized AFCI device-under-test 104 provides power to real load 124. The load current is typically 5 amps and is currently the requirement per UL1699. After the AC power is applied to AFCI device-under-test 104 and device 104 is switched on to close the circuit, a test operator initiates test start signal 136. Test start signal 136 resets timer device 118, starts a clock and enables series arcing simulator apparatus 100. Thus, high frequency broadband noise signal 140 is amplified by amplifier 142, filtered by low pass filter 146, modulated by amplitude modulator 150 and then coupled into the electrical circuit by high frequency coupler 120 to simulate series arcing. AFCI device-under-test 104 should detect the signal characteristics of the simulated series arcing signal coupled into the electrical circuit fault and open the circuit in less than 1 second per UL1699. Continuity detector 114 detects the open circuit and sends signal 116 to timer device 118 to stop the clock. Timer device 118 then sends signal 130 to indicator device 134 to alert operator that the AFCI device-under-test 104 has passed. The elapsed time could also be sent to indicator device 134 and recorded. Signal 130 will indicate that AFCI device-under-test 104 has failed if the elapsed time on the clock exceeds 1 second.

Referring to FIG. 7, high frequency broadband noise source 138 preferably has a bandwidth of 10 kHz to 100 MHz. Depending upon the detection method of the particular AFCI device-under-test, significantly less bandwidth may be required, or significantly more bandwidth may be required as future technology in detection methods for AFCI devices develops. In one embodiment, commercially available noise diodes are used to generate high frequency broadband noise. It has been found that noise diodes are ideal for simulating arcing noise. In an alternate embodiment, a commercially available arbitrary waveform generator is used to generate high frequency broadband noise up to 80 Mhz. High frequency broadband noise signal 140 generated by high frequency broadband noise source 138 can be represented as a function of time n(t). High frequency broadband noise signal 140 has relatively low amplitude but is amplified by amplifier 142. In a preferred embodiment, amplifier 142 is a wideband, high gain amplifier with adjustable gain. In one embodiment, amplifier 142 comprises a plurality of stages of amplifiers. Amplifier 142 increases the amplitude to an output level similar to that of actual series arcing. Since the gain of amplifier 142 is adjustable, it allows the test operator to calibrate the amplitude of the simulated series arcing signal. If high frequency broadband noise source 138 is configured as a noise diode circuit with output noise density of −140 dBm/Hz, then amplifier 142 is configured to have 60 dB of gain thereby achieving an output noise density of −80 dBm/Hz. The outputted high frequency broadband noise signal 140 can be represented by the following formula:

$$A \times n(t),$$

wherein:
"A" is the adjustable gain of the amplifier; and
n(t) is the noise signal as a function of time.

The high frequency broadband noise due to series arcing noise is due to the impulse characteristic of the series arcing as a function of time δ(t) (ideal case). A Fourier transform shows a flat power signal response X(f)=1. In reality, the impulse as a function of time is closer defined as $e^{-\alpha|t|}$. The power signal has an amplitude response that decreases as the frequency increases, namely:

$$X(f) = (2\alpha)/(\alpha 2 + 4\pi^2 f^2).$$

Figure 8:
FIG. 8 is a waveform of high frequency broadband noise generated by a high frequency broad band noise source shown in FIG. 7.

Thus, it is desirable that low pass filter 146 be configured to provide a two-pole low pass filter response in order to simulate the power versus frequency response of series arcing. In alternate embodiments, low pass filter 146 is combined with amplifier 142 or amplitude modulator 150. In another embodiment, amplifier 142 is configured as an amplifier with the desired frequency response. In yet another embodiment, the positions of the low pass filter 146 and amplifier 142 are switched so that low pass filter 146 is between high frequency broadband noise source 138 and amplifier 142. When the frequency bandwidth of interest of the AFCI device-under-test is relatively narrow and the amplitude is relatively flat, the low pass filter response is not required and thus, low pass filter 146 can be omitted. The obvious advantage of swapping the order of the low pass filter and the amplifier is that the frequency and power requirements are then relaxed for the amplifier. The resulting high frequency broadband noise signal 140 can be represented by the formula:

$$N(t) = h(t) * A \times n(t)$$

wherein: h(t) is the low pass filter time response. The noise signal waveform is shown in FIG. 8.

Figure 9:
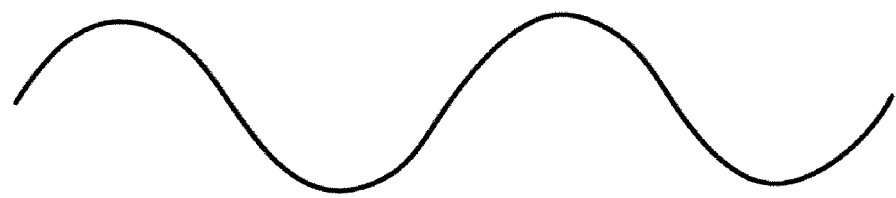
FIG. 9 is a waveform of a signal outputted by a low frequency coupler shown in FIG. 7.

Referring to FIG. 7, low frequency coupler 122 provides output signal 126 that represents the low frequency component of the AC power provided by power source 102. Signal 126 can be a representative signal of the load current or line-to-neutral voltage. The primary function of signal 126 is to synchronize the simulated series arcing noise signal to the load current or line-to-neutral voltage. Signal 126 is represented as Sin(2πft) as shown in FIG. 9.

Figure 10:
FIG. 10 is a waveform of a signal outputted by modulation signal generator shown in FIG. 7.

Referring to FIGS. 7 and 10, modulation signal generator 128 provides signal 154 to amplitude modulator 150 to shape the amplitude of the simulated high frequency broadband noise signal. The waveform of signal 154 is shown in FIG. 10. Signal 154 is synchronized to the load current or line-to-neutral voltage using signal 126 provided by low frequency coupler 122. Signal 154 is derived directly from signal 126. In an alternate embodiment, signal 154 is generated in another manner and synchronized to signal 126. Signal 154, if derived directly from signal 126, is represented by the following formula:

$$m(t) = C \times [1 - B \times |Sin(2\pi ft)|] \times [u(t - Td - (n \times T/2)) - u(t - (T/2 - Td) - (n \times T/2))]$$

wherein: T=1/f, and Td=burst delay, n=0, 1, 2, half cycle
When AFCI device-under-test 104 does not use the variation in amplitude versus time during a burst, then signal 126 can be represented simply by the formula:

$$m(t) = C \times [u(t - Td - (n \times T/2)) - u(t - (T/2 - Td) - (n \times T/2))]$$

wherein: T=1/f, and Td=burst delay, n=0, 1, 2, . . . half cycle. The burst delay should be adjustable so it can be calibrated.

Figure 11:
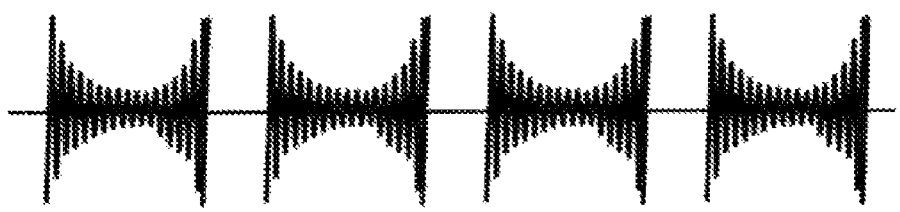
FIG. 11 is a waveform of a signal outputted by an amplitude modulator shown in FIG. 7.

Referring to FIGS. 7 and 11, amplitude modulator 150 multiplies the high frequency broadband noise with synchronized modulating signal 154. The resulting output signal 152 is high frequency broadband noise bursts with the burst envelopes shaped by the modulating signal 154 as shown in FIG. 11. Signal 152 can be represented by the formula:

$$s(t) = m(t) \times N(t)$$

wherein: m(t) and N(t) are defined above.
Amplitude modulator 150 can be configured as a voltage or current controlled amplifier or attenuator.

Figure 12:
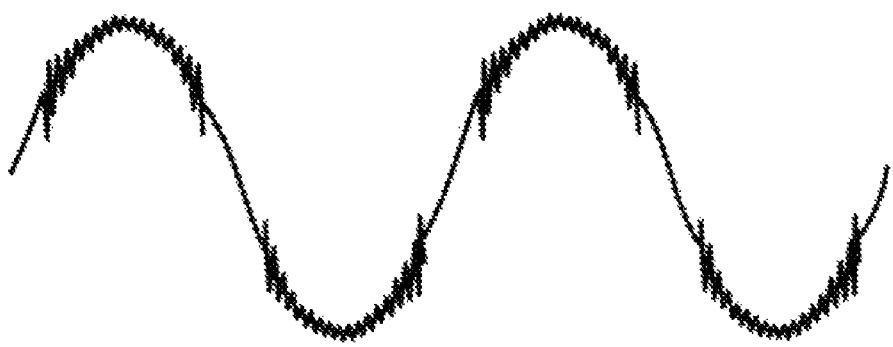
FIG. 12 is a waveform of a signal outputted by a high-frequency coupler shown in FIG. 7.

Referring to FIGS. 7 and 12, high frequency coupler 120 injects the synchronized high frequency broadband noise bursts into the load current or line-to-neutral voltage to produce the simulated series arcing signal detected by AFCI device-under-test. The signal having the synchronized high frequency broadband noise bursts is represented by the waveform shown in FIG. 12. This signal has the same characteristics of the signal shown in FIG. 2 which is generated from actual series arcing. The simulated series arcing signal shown in FIG. 12 can be represented by the formula:

$$r(t)=s(t)+\mathrm{Sin}(2\pi ft)$$

wherein: s(t) is defined above.

Referring to FIG. 7, continuity detector 114 monitors the line voltage or the load current to determine if AFCI device-under-test 104 is open or closed and sends signal 116 to timer device 118 to indicate whether the AFCI device-under-test 104 is open or closed. Timer device 118 is activated upon receiving start-test signal 136. Although the application of signal 136 to timer device 118 is initiated by the test operator, signal 136 is actually generated by a computer, microcontroller or other suitable circuitry. Upon receipt of start-test signal 136, timer device 118 resets an internal clock and enables simulated series arcing apparatus 100. The enablement of apparatus 100 is achieved by enabling modulation signal generator 128, high frequency broadband noise source 138, or any other element in the modulating signal path or the high frequency broadband noise signal path. In an alternate embodiment, this is accomplished by opening or closing a switch in the modulating signal path or the high frequency broadband noise signal path. Timer device 118 also monitors the signal from continuity detector 114. Timer device 118 allows its internal clock to run while timer device 118 receives a signal that AFCI device-under-test 104 is closed. If timer device 118 receives a signal that AFCI device-under-test 104 is open before a predetermined amount of time elapses, then timer device 118 emits a signal 130 to indicator device 134 that alerts the test operator that AFCI device-under-test 104 has passed. If a predetermined amount of time elapses before signal 136 is sent to indicator device 118 to indicate AFCI device-under-test 104 is open, timer device 118 then sends signal 136 that indicates AFCI device-under-test 104 has failed. Timer device 118 also disables the simulated series arcing apparatus 100. In an alternate embodiment, timer device 118 is configured to so that signal 136 also includes actual data such as the amount of time elapsed on internal clock of timer device 118.

Referring to FIG. 7, indicator device 134 provides to the test operator the status or results of a test performed on AFCI device-under-test 104. Indicator device 134 can be configured to alert the test operator by any suitable technique, e.g. visual display, audible signal, etc. For example, indicator device 118 can be configured to that the data is displayed through an LCD display. In another example, the data can be recited through an audible device. In an alternate embodiment, indicator device 134 may be configured with a data storage element to store the data. In another embodiment, indicator device 134 comprises a computer or microcontroller.

Figure 13:
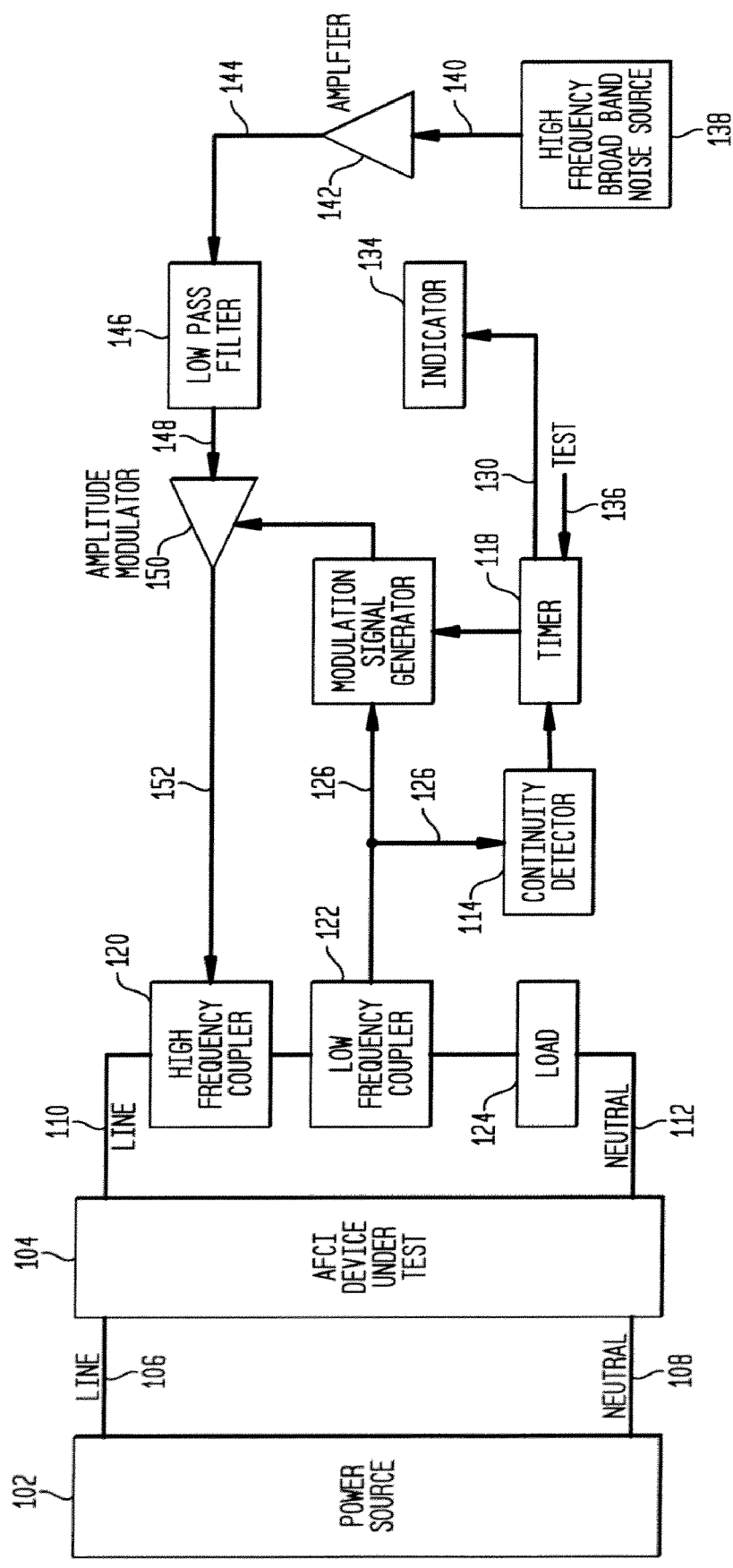
FIG. 13 is a block diagram of a series arcing simulator apparatus in accordance with another embodiment of the present invention.

FIG. 13 shows an alternate series arcing simulator apparatus 100☐ wherein continuity detector 114 monitors signal 126 that is provided by low frequency coupler As described in the foregoing description, signal 126 is representative of the load current or line-to-neutral voltage. In an alternate embodiment, continuity detector 114 and low frequency coupler 122 can be combined into a single component.

Figure 14:
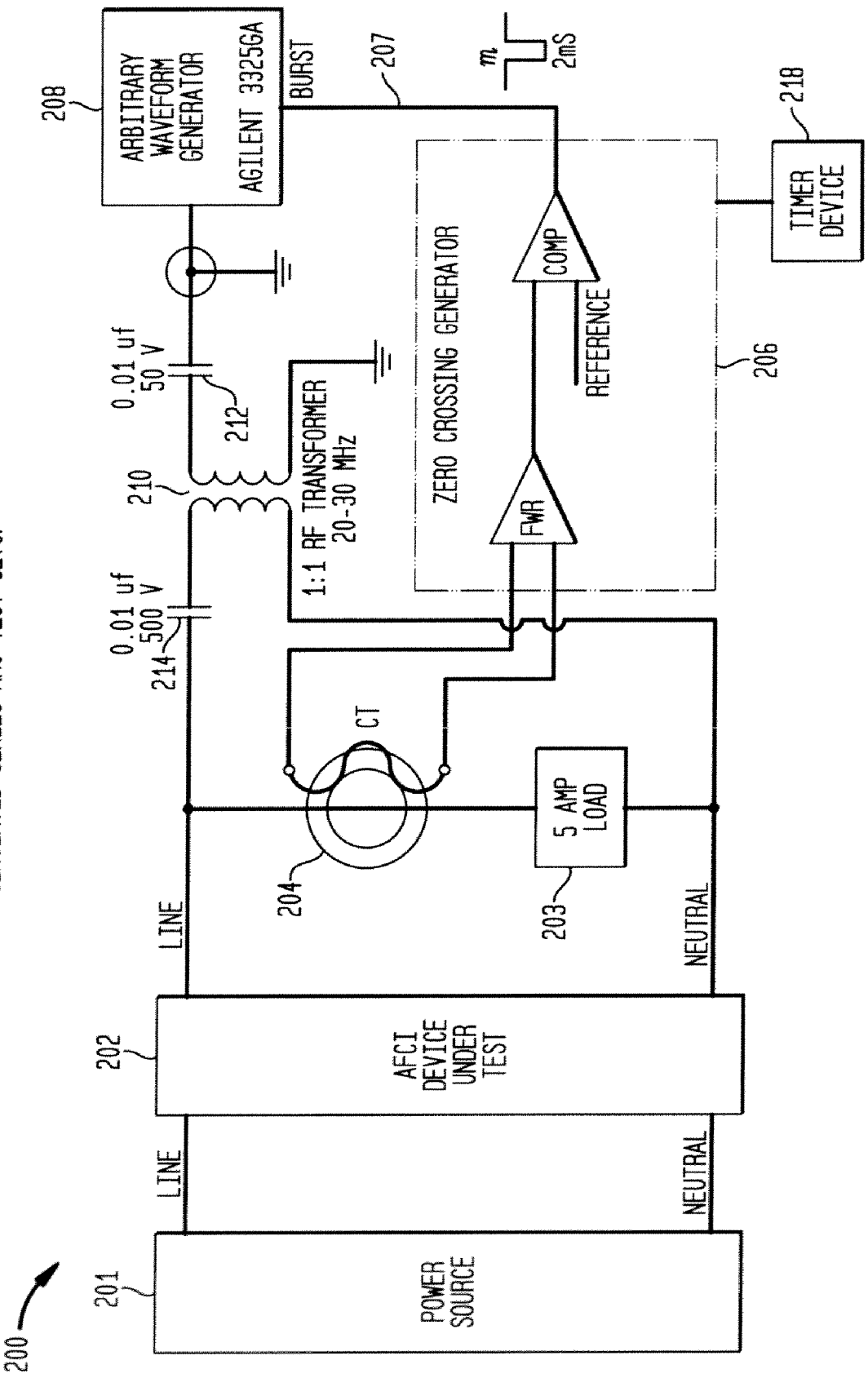
FIG. 14 is a block diagram of a series arcing simulator apparatus in accordance with a further embodiment of the present invention.

Referring to FIG. 14, there is shown simulated series arcing testing apparatus 200 in accordance with another embodiment of the present invention. Apparatus 200 includes power source 201 that provides power to AFCI device 202. Apparatus 200 further includes real load 203 which is preferably a 5 Amp load. Current transformer 204 is in series with real load 203 and performs the function of low frequency coupler 122 (see FIG. 7). Thus, current transformer 204 provides the low frequency component of the load current to a zero-crossing generator 206. Zero-crossing generator 206 performs the function of modulation signal generator 128 (see FIG. 7) and outputs a TTL level signal 207, which is synchronized to the load current, into an arbitrary waveform generator 208. One suitable arbitrary waveform generator is the Agilent 33250A. The burst delay is adjustable in zero-crossing signal generator 206 which is important for calibration of apparatus 200. In the case of some AFCI devices on the market, shaping the burst is not required for series arc detection. In a preferred embodiment, arbitrary waveform generator 208 includes a high frequency broadband noise source, an amplifier, low pass filter and amplitude modulator. Thus, arbitrary waveform generator 208 performs the functions of high frequency broadband noise source 138, amplifier 142, low pass filter 146 and amplitude modulator 150 which were discussed in the foregoing description and shown in FIG. 7. Arbitrary waveform generator 208 is configured to generate high frequency broadband noise that has a flat frequency response to approximately 80 MHz. Preferably, the output level capability of arbitrary waveform generator 208 exceeds −80 dBm/Hz and the output level is adjustable so as to allow calibration of apparatus 200. The signal outputted by zero-crossing signal generator 206 is fed into the burst port of the arbitrary waveform generator 208 which gates (amplitude modulates at 100%) the high frequency broadband noise output. Apparatus 200 further comprises RF transformer 210 and series capacitors 212 and 214. RF transformer 210 and series capacitors 212 and 214 function as a high frequency coupler that injects the synchronized high frequency broadband noise bursts into real load 203. Apparatus 200 includes timer device 218. Timer device 218 generally performs the same functions as timer device 118 shown in FIG. 7. In addition to those functions, timer device 218 also enables and disables zero-crossing generator 206. In an alternate embodiment, timer device 218 enables and disables the output of arbitrary waveform generator 208 at the start and end of a test. Apparatus 200 includes a continuity detector which is not shown FIG. 14.

Figure 15:
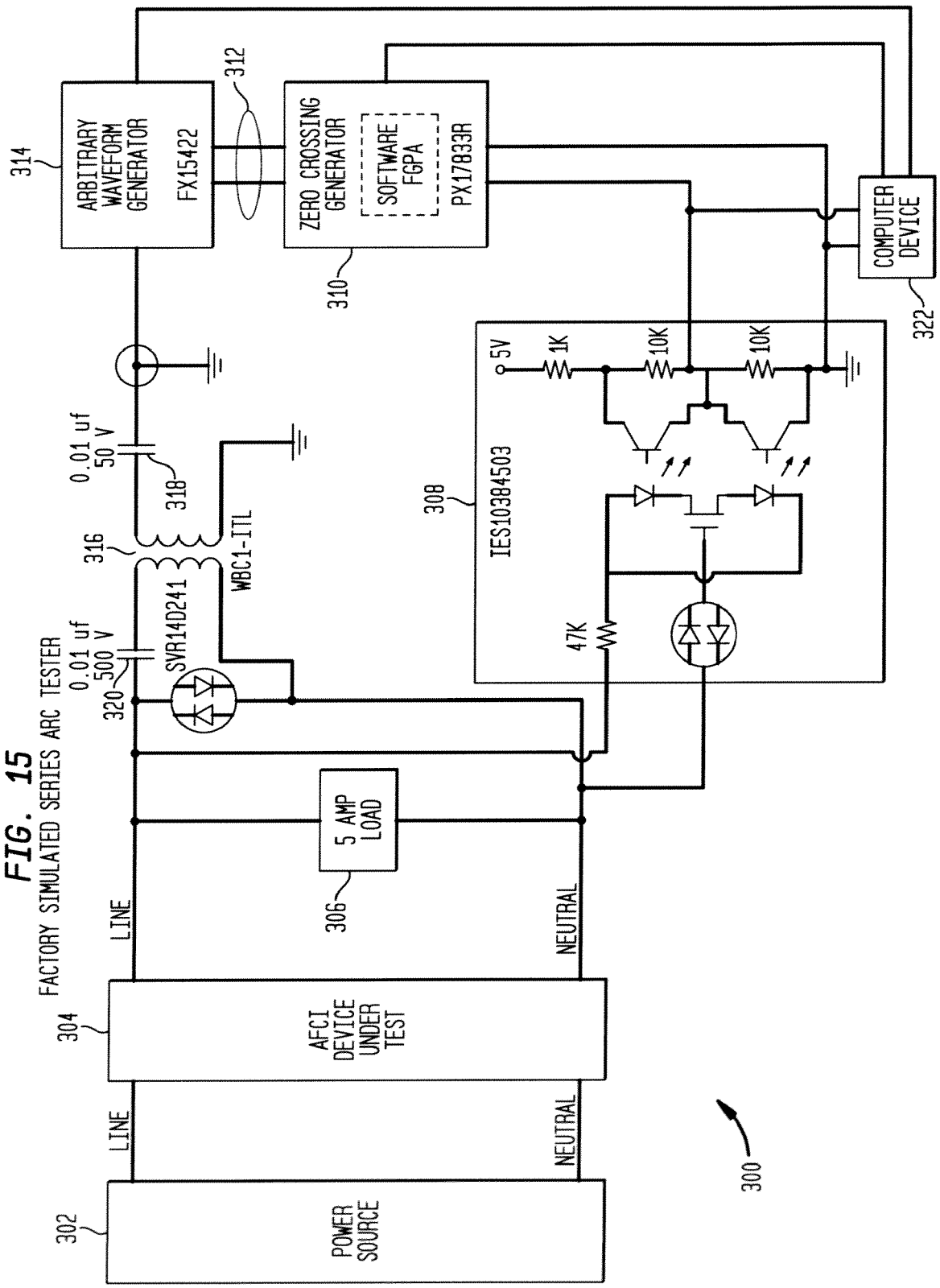
FIG. 15 is a block diagram of a series arcing simulator apparatus in accordance with another embodiment of the present invention.

Referring to FIG. 15, there is shown series arcing simulator apparatus 300 in accordance with a further embodiment of the present invention. Apparatus 300 includes AC power source 302 which provides power to AFCI device-under-test 304. Real load 306 is at the output of AFCI device-under-test 304. Real load 306 is preferably a 5.0 Amp load. Apparatus 300 comprises an interface board 308 which has a plurality of optical couplers. In one embodiment, interface board 308 is configured as the commercially available IES10394503 interface board. One of the aforementioned optical couplers functions as a low frequency coupler that provides the low frequency components of the line-to-neutral voltage to zero-crossing generator 310. In one embodiment, zero-crossing generator 310 is configured as a Software Field Programmable Gate Array (PXI7833R). Zero-crossing generator 310 functions as a modulation signal generator and outputs zero-crossing signal (pulse signal) 312, which is synchronized to the line-to-neutral voltage, into arbitrary waveform generator 314 (e.g. PXI5422). Since load 306 is a real load, the zero-crossing signal 312 is synchronized to the load current as well. The pulse width and delay is adjustable in zero-crossing generator 310 which is important for calibration of apparatus 300. Arbitrary waveform generator 314 includes a high frequency broadband noise source, an amplifier, low pass filter and amplitude modulator, the functions of which components were described in the foregoing description. Arbitrary waveform generator 314 generates an amplitude-modulated high frequency broadband noise signal 315 that has a flat frequency response to approximately 80 MHz. Preferably, arbitrary waveform generator 314 has an output level capability that exceeds −80 dBm/Hz and the output level of signal 315 is adjustable which is important for calibration of apparatus 300. If the AFCI device-under-test has a relatively narrow frequency bandwidth, the low pass filter component may be omitted. Signal 312 is inputted into the burst port of arbitrary waveform generator 314 which gates (amplitude modulates at 100%) the high frequency broad band noise output signal 315. Apparatus 300 includes RF transformer 316 and series capacitors 318 and 320 which cooperate to function as a high-frequency coupler that injects the synchronized high frequency broadband noise bursts 315 into real load 306. In one embodiment, each capacitor 318 and 320 has a capacitance of 0.01 uF. Another optical coupler on interface board 308 functions as a continuity detector. In one embodiment, RF transformer 316 is a commercially available Coilcraft WBC1-1TL.

Apparatus 300 includes computer device 322. Computer device 322 performs the same functions as timer device 118 and indicator device 134 which were described in the foregoing description and shown in FIG. 7. The computer device 322 provides a display that indicates whether the AFCI device-under-test 304 passes or fails the test and to display the test data (time elapsed for AFCI device-under-test 304 to detect series arcing and open the circuit). Computer device 322 includes timing circuitry that resets at the beginning of each test. This timing circuitry also starts the clock, enables and disables the zero-crossing generator 310 and arbitrary waveform generator 314, and turns output signal 315 of arbitrary waveform generator 314 on and off at the beginning and end of each test. Computer device 322 also provides the test operator with a user interface to calibrate apparatus 300, and start and execute series arcing tests along with a number of other tests performed on the AFCI device, and record test data to memory.

Thus, the present invention provides the following advantages and benefits:
(a) the need for an arc gap and relay, and associated disadvantages, are eliminated;
(b) the electronics of the apparatus of the present invention can be integrated into a very small ASIC and powered from low voltage power sources such as standard AA or other class batteries, and since all other electronic components are relatively small in size, the apparatus of the present invention can be easily configured as a portable AFCI tester;
(c) the characteristics (amplitude and time) of the simulated arcing signal 7 generated by the apparatus of the present invention are consistent and repeatable which produce consistent, repeatable, measurable, and reliable test results;
(d) the characteristics (amplitude and time) of the simulated arcing signal generated by the apparatus of the present invention are adjustable using electronic adjustments and thus can be repeatedly calibrated to produce the desired test signal;
(e) any variations in the characteristics of the simulated arcing signal due to environmental conditions can be compensated using electronics;
(f) the electronic components of the apparatus of the present invention are relatively more reliable than the relay and arc gap;
(g) the electronic components of the apparatus of the present invention are relatively less in cost than the relay and arc gap; and
(h) there is relatively less chance of exposure to electric shock in comparison to prior art testing devices that use the relay and arc gap.

Thus, a significant portion of the electronics of the apparatus of the present invention can be incorporated into an ASIC thereby allowing the present invention to be used in (1) factories to test AFCI devices for mass production, or (2) portable units for use by electricians to test AFCI devices installed in residences.

While the foregoing description is exemplary of the present invention, those of ordinary skill in the relevant arts will recognize the many variations, alterations, modifications, substitutions and the like are readily possible, especially in light of this description, the accompanying drawings and the claims drawn hereto. In any case, because the scope of the invention is much broader than any particular embodiment, the foregoing detailed description should not be construed as a limitation of the present invention, which is limited only by the claims appended hereto.

What is claimed is:

1. A method for testing an AFCI device, comprising the steps of:
providing an AFCI device-under-test and a load, wherein the AFCI device and the load form an electrical circuit;
applying an AC power to the AFCI device;
generating a high frequency broadband noise signal;
amplifying the high frequency broadband noise signal;
modulating the high frequency broadband noise signal with a signal synchronized to the load current or load voltage to provide synchronized high frequency broadband noise bursts;
coupling the synchronized high frequency broadband noise bursts into the electrical circuit to simulate series arcing signals; and
determining if the AFCI device opens the electrical circuit within a predetermined amount of time and issuing a signal that indicates if the electrical circuit is opened or closed.

2. The method according to claim 1 further comprising the step of filtering the amplified high frequency broadband noise signal with a low pass filter.

3. The method according to claim 1 further comprising the step of indicating the AFCI device has passed the test if the AFCI opens the electrical circuit within the predetermined amount of time.

4. The method according to claim 3 further comprising the step of indicating the AFCI device has failed the test if the AFCI device fails to open the electrical circuit within the predetermined amount of time.

5. The method according to claim 4 further comprising the step of measuring the amount of time that has elapsed before the AFCI device opens the electrical circuit.

6. The method according to claim 1 wherein the step determining if the AFCI device opens the electrical circuit comprises the step of monitoring the line voltage in the electrical circuit to determine if the AFCI device is open or closed.

7. The method according to claim 1 wherein the step determining if the AFCI device opens the electrical circuit comprises the step of monitoring the current flowing through the load to determine if the AFCI device is open or closed.

8. The method according to claim 1 wherein the coupling step comprises coupling the synchronized high frequency broadband noise bursts into the line-to-neutral voltage of the electrical circuit.

9. The method according to claim 1 wherein the coupling step comprises coupling the synchronized high frequency broadband noise bursts into the load current.

10. The method according to claim 1 wherein the modulating step further comprises the step of providing the signal that is synchronized to the load current or load voltage.

11. The method according to claim 10 wherein the signal that is synchronized to the load current or load voltage comprises the low frequency components of the AC power.

12. An apparatus for testing an AFCI device, comprising:
an AC power source to provide AC power;
a load;
one or more conductors for connecting an AFCI device-under-test to the AC power source and the load so that AFCI device-under-test and the load form an electrical circuit to which the AC power is applied;
a high frequency broadband noise generator for generating a high frequency broadband noise signal;
an amplifier for amplifying the high frequency broadband noise signal to provide an amplified high-frequency broadband noise signal;
a modulator to modulate the high frequency broadband noise signal with a signal synchronized to the load current or load voltage so as to provide synchronized high frequency broadband noise bursts;
a coupling device to couple the synchronized high frequency broadband noise bursts into the electrical circuit to simulate series arcing signals, and
a detector device for detecting if the AFCI device opens the electrical circuit within a predetermined amount of time and issuing a signal that indicates if the electrical circuit is opened or closed.

13. The apparatus according to claim 12 further comprising a low pass filter for filtering the high frequency broadband noise signal prior to its modulation.

14. The apparatus according to claim 12 wherein the signal synchronized to the load current or load voltage comprises the low frequency component of the AC power applied to the electrical circuit and wherein the apparatus further comprises a device in electrical signal communication with the electrical circuit for providing the low frequency component of the AC power to the modulator.

15. The apparatus according to claim 14 wherein the device to provide the signal synchronized to the load current or load voltage comprises a low frequency coupler.

16. The apparatus according to claim 12 wherein the modulator comprises an amplitude modulator for receiving the high frequency broadband noise signal and a modulation signal generator in electrical signal communication with the low frequency coupler and the amplitude modulator.

17. The apparatus according to claim 12 wherein the coupling device comprises a high frequency coupler in electrical signal communication with the electrical circuit.

18. The apparatus according to claim 12 wherein the detecting device comprises a continuity detector.

19. The apparatus according to claim 12 further comprising an indicating device for indicating the AFCI device has passed the test if the AFCI opens the electrical circuit within the predetermined amount of time and for indicating the AFCI device has failed the test if the AFCI device fails to open the electrical circuit within the predetermined amount of time.

20. The apparatus according to claim 19 further comprising a control circuit in electrical signal communication with the detector device and the indicating device, the control circuit controlling the indicator device to (i) indicate the AFCI device has passed the test if the signal issued by the detector device indicates the AFCI device has opened the electrical circuit within the predetermined amount of time, and (ii) to indicate the AFCI has failed the test if the signal issued by the detector device indicates the AFCI device did not open the electrical circuit within the predetermined amount of time.

21. The apparatus according to claim 20 wherein the control circuit comprises timing circuitry that comprises a clock that measures elapsed time and compares the elapsed time to the predetermined amount of time.

22. The apparatus according to claim 20 wherein control circuit is in electrical signal communication with the modulator and wherein the control circuit has an input for receiving an enabling signal to initiate a test of an AFCI device, the control circuit issuing an enabling signal to the modulator in order to begin a test of an AFCI device.

23. The apparatus according to claim 20 wherein the apparatus further comprises a modulation signal generator in electrical signal communication with the modulator and wherein the control circuit is in electrical signal communication with the modulation signal generator, wherein the control circuit has an input for receiving an enabling signal to initiate a test of an AFCI device, the control circuit issuing an enabling signal to the modulation signal generator in order to begin a test of an AFCI device.

24. The apparatus according to claim 20 wherein the control circuit is in electrical signal communication with the high frequency broadband noise generator and wherein the control circuit has an input for receiving an enabling signal to initiate a test of an AFCI device, the control circuit issuing an enabling signal to the high frequency broadband noise generator in order to begin a test of an AFCI device.

25. The apparatus according to claim 20 wherein the control circuit is in electrical signal communication with the coupling device and wherein the control circuit has an input for receiving an enabling signal to initiate a test of an AFCI device, the control circuit issuing an enabling signal to the coupling device in order to begin a test of an AFCI device.

26. The apparatus according to claim 20 further comprising a low pass filter for filtering the high frequency broadband noise signal prior to its modulation, wherein the control circuit is in electrical signal communication with the low pass filter and wherein the control circuit has an input for receiving an enabling signal to initiate a test of an AFCI device, the control circuit issuing an enabling signal to the low pass filter in order to begin a test of an AFCI device.

27. The apparatus according to claim 20 further comprising an amplifier for amplifying the high frequency broadband noise signal prior to its modulation and wherein the control circuit is in electrical signal communication with the amplifier and wherein the control circuit has an input for receiving an enabling signal to initiate a test of an AFCI device, the control circuit issuing an enabling signal to the amplifier in order to begin a test of an AFCI device.

28. The apparatus according to claim 20 wherein the signal synchronized to the load current or load voltage comprises the low frequency component of the AC power applied to the electrical circuit and wherein the apparatus further comprises a low frequency coupler in electrical signal communication with the electrical circuit for providing the low frequency component of the AC power to the modulator, wherein the control circuit is in electrical signal communication with the low frequency coupler and wherein the control circuit has an input for receiving an enabling signal to initiate a test of an AFCI device, the control circuit issuing an enabling signal to the low frequency coupler in order to begin a test of an AFCI device.

29. An apparatus for testing an AFCI device, comprising:
an AC power source;
a load;

one or more conductors for connecting an AFCI device-under-test to the AC power source and the load so that AFCI device-under-test and the load form an electrical circuit;

means for generating a high frequency broadband noise signal;

means for amplifying the high frequency broadband noise signal;

means for modulating the high frequency broadband noise signal with a signal synchronized to the load current or load voltage to provide synchronized high frequency broadband noise bursts;

means for coupling the synchronized high frequency broadband noise bursts into the electrical circuit to simulate series arcing signals; and means for detecting if the AFCI device opens the electrical circuit within a predetermined amount of time and issuing a signal that indicates if the electrical circuit is opened or closed.

30. The apparatus according to claim 29 further comprising means for filtering the high frequency broadband noise signal prior to its modulation.

31. The apparatus according to claim 29 wherein the signal synchronized to the load current or load voltage comprises the low frequency component of the AC power applied to the electrical circuit and wherein the apparatus further comprises means, in electrical signal communication with the electrical circuit, for providing the low frequency component of the AC power to the modulating means.

32. The apparatus according to claim 29 further comprising means for indicating the AFCI device has passed the test if the AFCI opens the electrical circuit within the predetermined amount of time and for indicating the AFCI device has failed the test if the AFCI device fails to open the electrical circuit within the predetermined amount of time.

33. The apparatus according to claim 32 further comprising a means, in electrical signal communication with the detector device and the indicating device, for controlling the indicator device to (i) indicate the AFCI device has passed the test if the signal issued by the detector device indicates the AFCI device has opened the electrical circuit within the predetermined amount of time, and (ii) to indicate the AFCI has failed the test if the signal issued by the detector device indicates the AFCI device did not open the electrical circuit within the predetermined amount of time.

34. The apparatus according to claim 33 wherein the means for controlling comprises timing circuitry that comprises a clock that measures elapsed time and compares the elapsed time to the predetermined amount of time.

35. The apparatus according to claim 33 wherein the means for controlling is in electrical signal communication with the modulator and wherein the means for controlling has an input for receiving an enabling signal to initiate a test of an AFCI device, the means for controlling issuing an enabling signal to the modulator in order to begin a test of an AFCI device.

36. The apparatus according to claim 33 wherein the apparatus further comprises a modulation signal generator in electrical signal communication with the means for modulating and wherein the control circuit is in electrical signal communication with the modulation signal generator, wherein the control circuit has an input for receiving an enabling signal to initiate a test of an AFCI device, the control circuit issuing an enabling signal to the modulation signal generator in order to begin a test of an AFCI device.

37. The apparatus according to claim 33 wherein the means for controlling is in electrical signal communication with the means for generating high frequency broadband noise and wherein the means for controlling has an input for receiving an enabling signal to initiate a test of an AFCI device, the means for controlling issuing an enabling signal to the means for generating high frequency broadband noise in order to begin a test of an AFCI device.

38. The apparatus according to claim 33 wherein the means for controlling is in electrical signal communication with the means for coupling and wherein the means for controlling has an input for receiving an enabling signal to initiate a test of an AFCI device, the means for controlling issuing an enabling signal to the means for coupling in order to begin a test of an AFCI device.

39. The apparatus according to claim 33 further comprising means for amplifying the high-frequency broadband noise, wherein the means for controlling is in electrical signal communication with the means for amplifying and wherein the means for controlling has an input for receiving an enabling signal to initiate a test of an AFCI device, the means for controlling issuing an enabling signal to the means for amplifying in order to begin a test of an AFCI device.

40. The apparatus according to claim 33 further comprising means for low pass filtering the high-frequency broadband noise, wherein the means for controlling is in electrical signal communication with the means for low pass filtering and wherein the means for controlling has an input for receiving an enabling signal to initiate a test of an AFCI device, the means for controlling issuing an enabling signal to the means for low pass filtering in order to begin a test of an AFCI device.

41. The apparatus according to claim 33 wherein the signal synchronized to the load current or load voltage comprises the low frequency component of the AC power applied to the electrical circuit and wherein the apparatus further comprises means, in electrical signal communication with the electrical circuit, for providing the low frequency component of the AC power to the means for modulating, wherein the control circuit is in electrical signal communication with the means for providing the low frequency component and wherein the control circuit has an input for receiving an enabling signal to initiate a test of an AFCI device, the control circuit issuing an enabling signal to the means for providing the low frequency component in order to begin a test of an AFCI device.

* * * * *